United States Patent [19]

Loose

[11] 4,336,431
[45] Jun. 22, 1982

[54] SOLDERLESS CIRCUIT BOARD CONTACT

[75] Inventor: Winfield W. Loose, Linglestown, Pa.

[73] Assignee: AMP Incorporated, Harrisburg, Pa.

[21] Appl. No.: 195,810

[22] Filed: Oct. 10, 1980

[51] Int. Cl.³ .......................... H01H 1/14; H01H 3/12
[52] U.S. Cl. ............................... 200/292; 200/159 A
[58] Field of Search ............... 200/247, 252, 253, 273, 200/283, 284, 292, 159 A, 5 A, 67 DB, 239, 243, 241, 246

[56] References Cited

U.S. PATENT DOCUMENTS

| | | | |
|---|---|---|---|
| 2,039,957 | 5/1936 | Hall | 200/284 |
| 3,109,071 | 10/1963 | Mitchell et al. | 200/159 A |
| 3,188,435 | 6/1965 | Rugsten | 200/246 |
| 4,032,728 | 6/1977 | Oelsch | 200/159 A |
| 4,107,499 | 8/1978 | Weidler | 200/292 |
| 4,136,269 | 1/1979 | Weidler | 200/159 A |

FOREIGN PATENT DOCUMENTS 1422508 11/1965 France ............................... 200/284

Primary Examiner—John W. Shepperd
Attorney, Agent, or Firm—Frederick W. Raring

[57] ABSTRACT

A resilient platelike spring contact member is disclosed of the type which is mounted on a circuit board in covering relationship to a first conductor and in electrical contact with a second conductor so that the platelike member can be flexed into engagement with the first conductor to establish a circuit path to the second conductor. The platelike member has a pair of legs extending therefrom which extend into holes in the circuit board and each leg has a laterally extending spring contact portion which bears against a second conductor on the circuit board. The legs are shaped such that when the contact member is assembled to the board, the legs are deformed and the contact member is secured on the board without solder or other bonding material.

9 Claims, 10 Drawing Figures

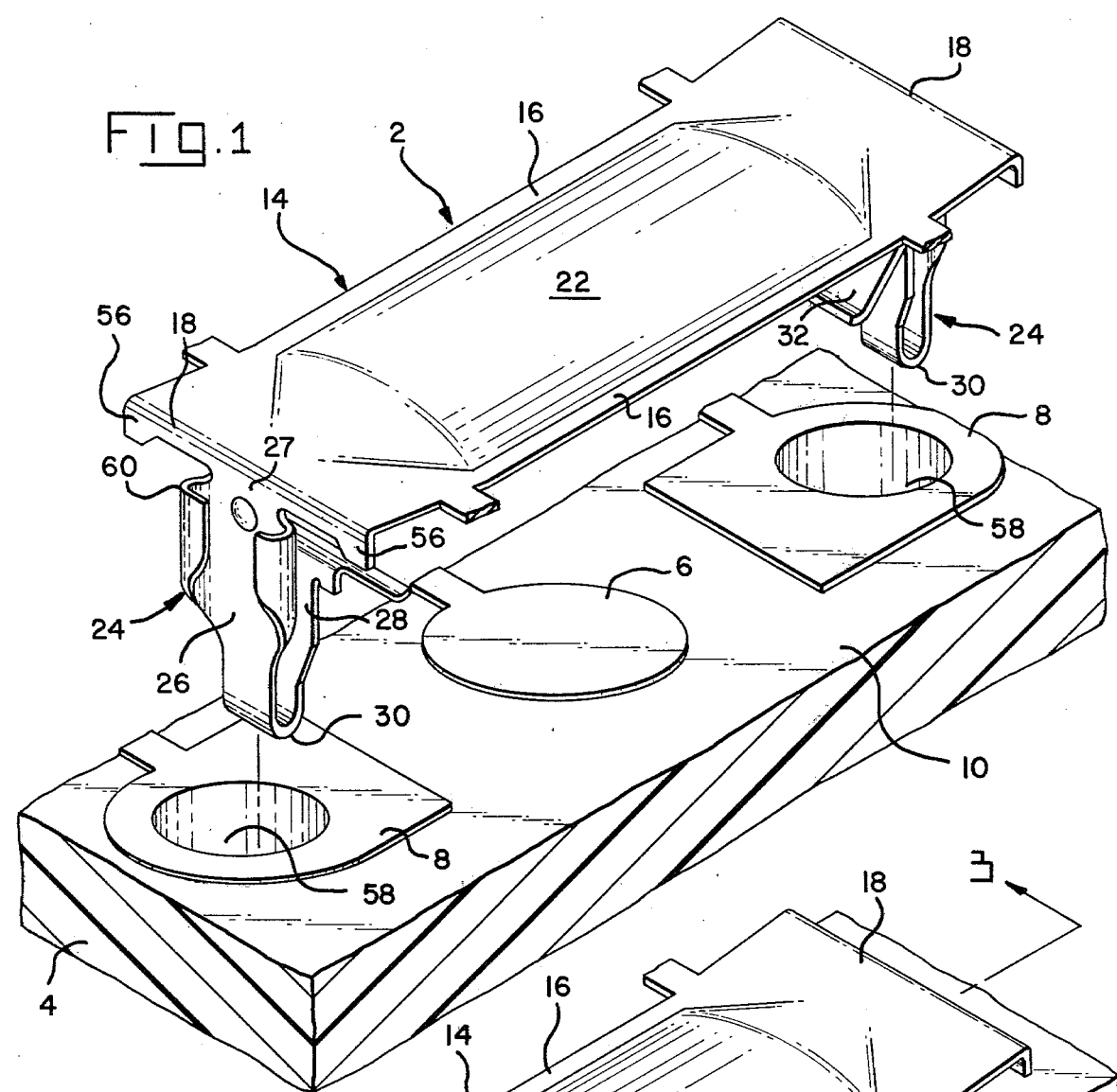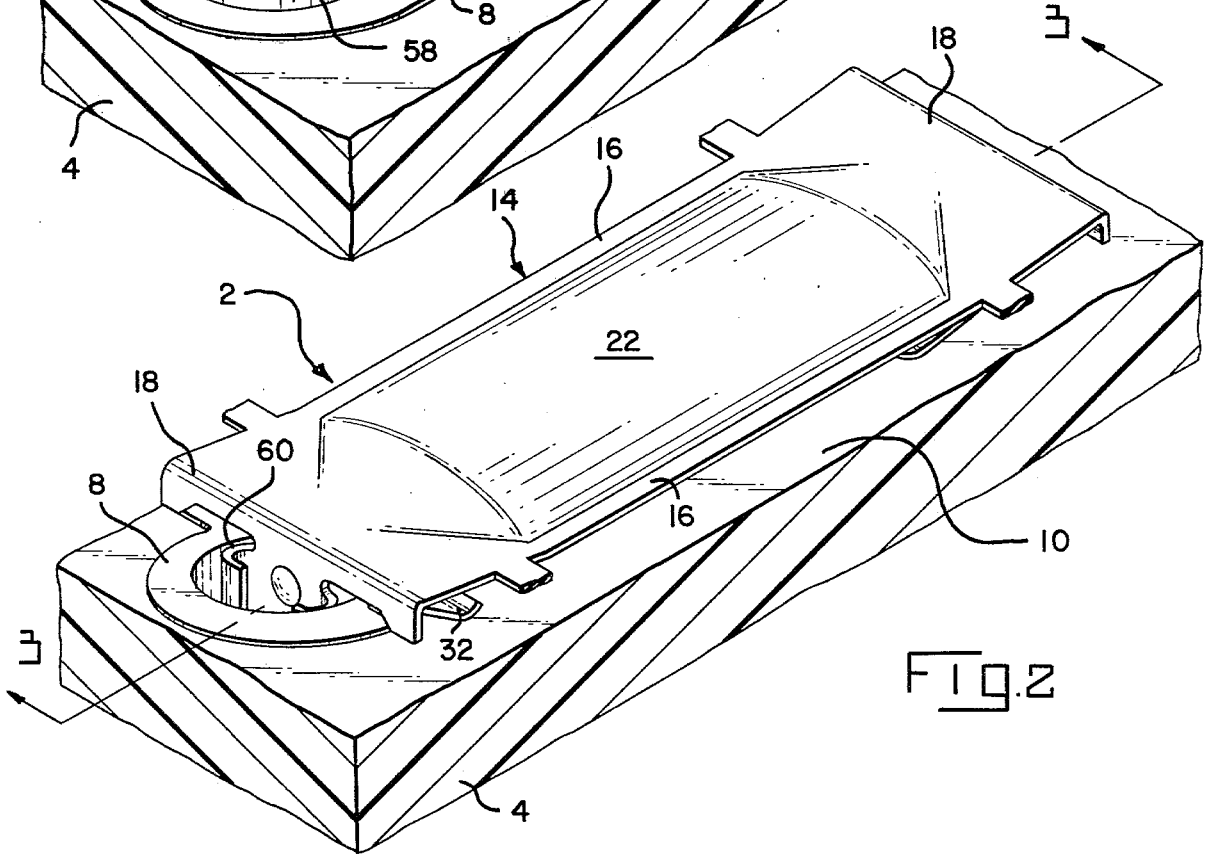

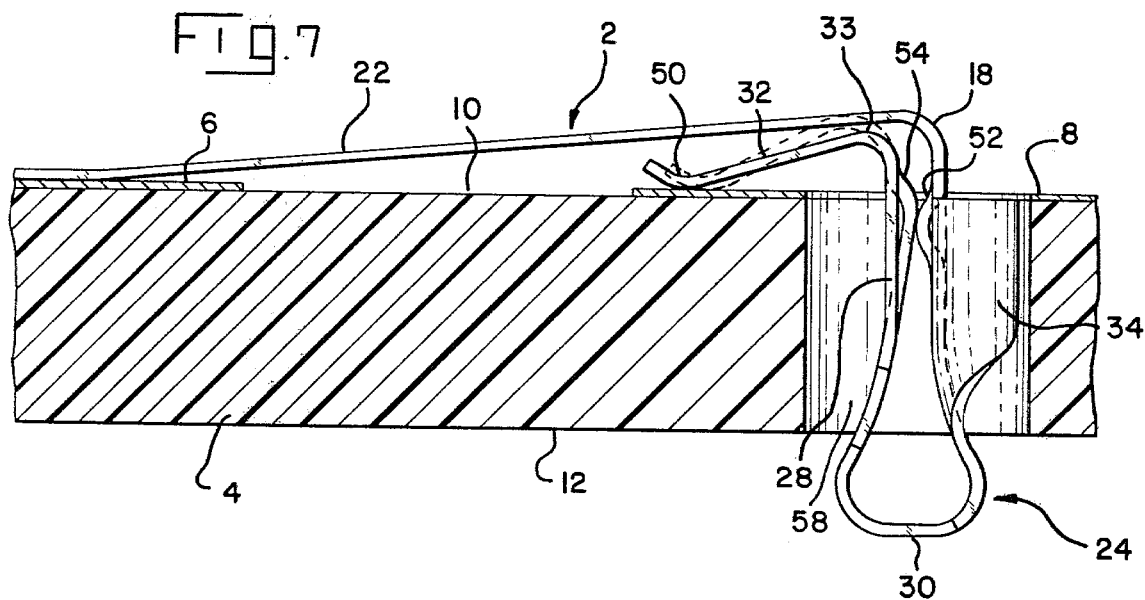
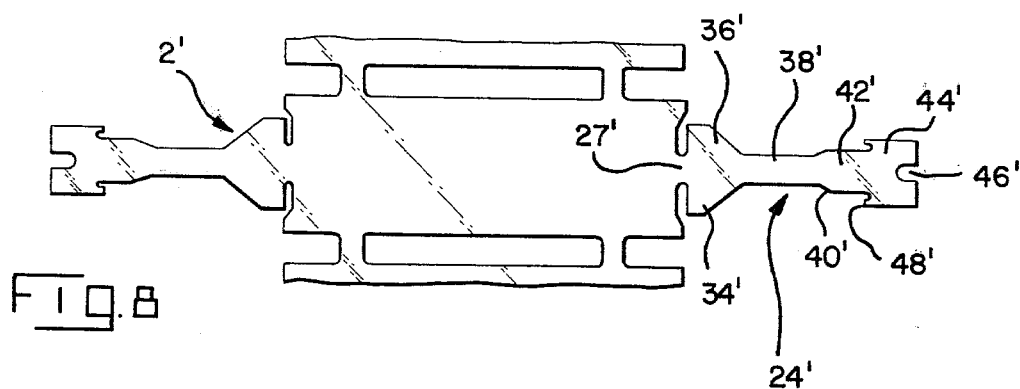
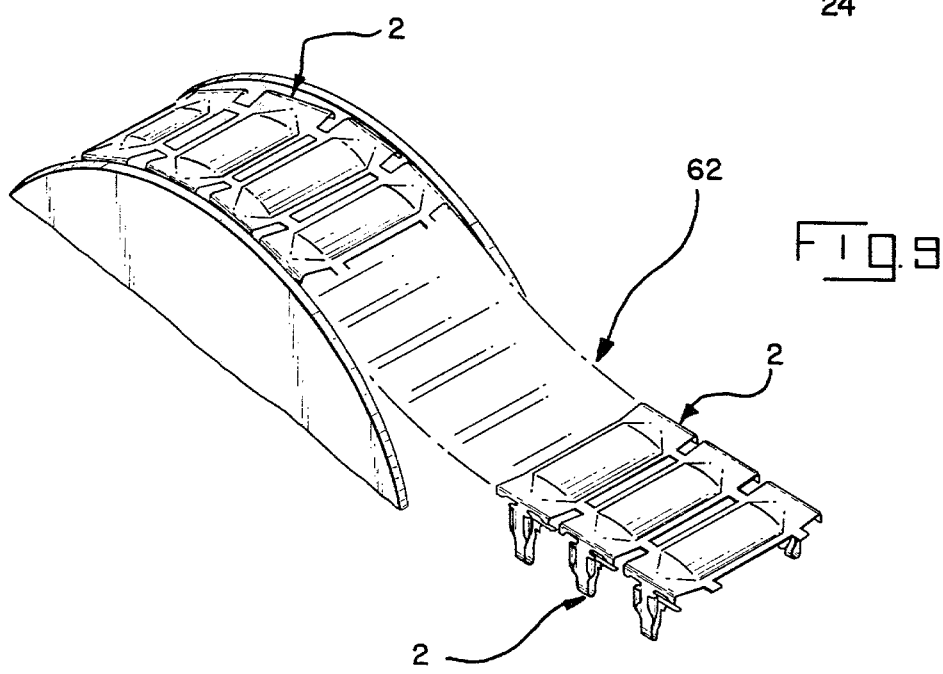

SOLDERLESS CIRCUIT BOARD CONTACT

FIELD OF THE INVENTION

This invention relates to platelike spring metal contact devices of the type which are mounted on circuit boards in covering relationship with one conductor on a circuit board in in electrical contact with a second conductor. When the platelike member is flexed towards and into engagement with the one conductor, a circuit path is established between the two conductors.

BACKGROUND OF THE INVENTION

A commonly used type of spring contact for circuit boards comprises a platelike spring contact having legs extending therefrom, which are inserted into holes in a circuit board, the holes being located such that the platelike member covers, and is in spaced relationship to, a first conductor on the circuit board. When the legs are soldered to second conductors on the circuit board, a circuit path can be established between the first and second conductors by flexing the platelike member towards the circuit board until it moves against the first conductor. The contact member usually forms part of a switch which is closed by simply pressing on the contact member and when finger pressure is removed, the platelike member returns to its normal position and the circuit path is broken. It is common to solder the legs of contact devices of this type to the second conductors on the circuit board, although it is known to rely entirely on mechanical fastening of the contact device to the circuit board, as shown, for example, in U.S. Pat. No. 4,136,269.

Most, if not all, of the spring contact devices discussed above are such that the first conductor, which is engaged by the platelike contact member, must be on one side of the circuit board and the second conductors must be on the other side of the circuit board. When the device is assembled to the board by inserting the legs through holes in the circuit board, the legs can then be soldered to the second conductors on the underside of the circuit board.

It would be desirable to provide a spring contact device which would be capable of use on a circuit board having all of its conductors on one surface thereof, in other words, a so-called one-sided circuit board. Circuit boards having conductors on only one surface thereof can usually be produced at a lower cost than circuit boards having conductors on both surfaces and are therefore preferred in the manufacture of many articles which must be produced at a minimum overall cost.

The invention is also directed to the achievement of an improved solderless spring contact member of the general type discussed above which can be assembled to the circuit board by a simple insertion operation and which will be placed in contact with conductors on the circuit board as the result of the assembly operation. The present invention is further directed to the achievement of a contact device which will prove to be reliable and durable after installation on the circuit board.

A spring metal contact member in accordance with the invention comprises a stamped and formed device of thin resilient material, such as stainless steel, having a platelike portion from which a pair of mounting legs extend, which are dimensioned to enter circuit board holes. Each mounting leg comprises an elongated strip which has been reversely formed to provide first and second side-by-side straight portions, a reversely formed bight portion, and a free end spring portion. The first leg is integral with and extends from the platelike section of the device and the first and second legs are connected to each other by an intermediate bight portion. The spring arm portion extends laterally from the second leg so that when the legs are inserted into the circuit board holes, the spring arms then extend laterally to conductors on the circuit board. During insertion, the bight portion of each leg and parts of each straight portion of each leg are severely plastically deformed and caused to move laterally of their original positions. This deformation of lower portions of the legs, coupled with other features of the legs, establishes an interference fit of each leg and its circuit board hole so that the device is permanently assembled to the circuit board. An important feature of the invention is that when the platelike portion of the device is pressed towards the circuit board and into engagement with a first conductor on the circuit board, the forces imposed on the platelike section of the device are transmitted to the spring arm portions which are caused to slide and rub over the second conductors which they are normally disposed against. This movement of the spring arm portions has the effect of cleaning these contact surfaces immediately prior to establishment of the circuit path and thereby ensures a high degree of reliability in the operation of the device.

DRAWINGS

FIG. 1 is a perspective view of a circuit board and a contact member exploded from a pair of holes in the circuit board.

FIG. 2 is a perspective view showing the contact member assembled to the circuit board.

FIG. 7 is a view similar to FIG. 6 but showing the positions of the parts when the platelike portion of the device is flexed into engagement with a first conductor on the circuit board to establish a circuit path between the first conductor and a second conductor on the circuit board.

FIG. 8 is a plan view of a blank from which the device is formed.

FIG. 9 is a view on a reduced scale of a short section of a strip of contact devices in accordance with the invention.

PRACTICE OF THE INVENTION

Figure 3:
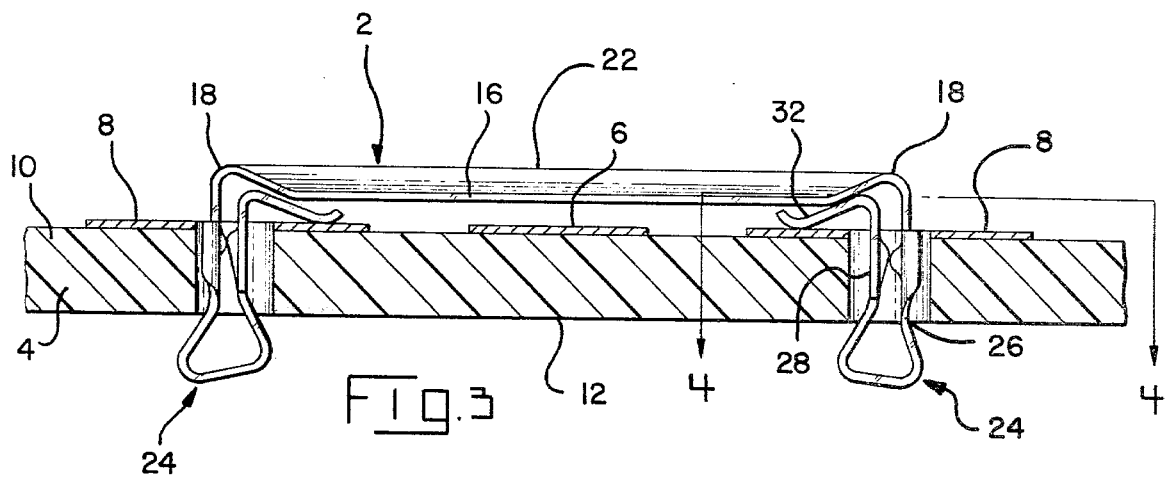
FIG. 3 is a cross-sectional view of the contact device mounted in the circuit board, this view being taken generally along the lines 3—3 of FIG. 2.
Figure 4:
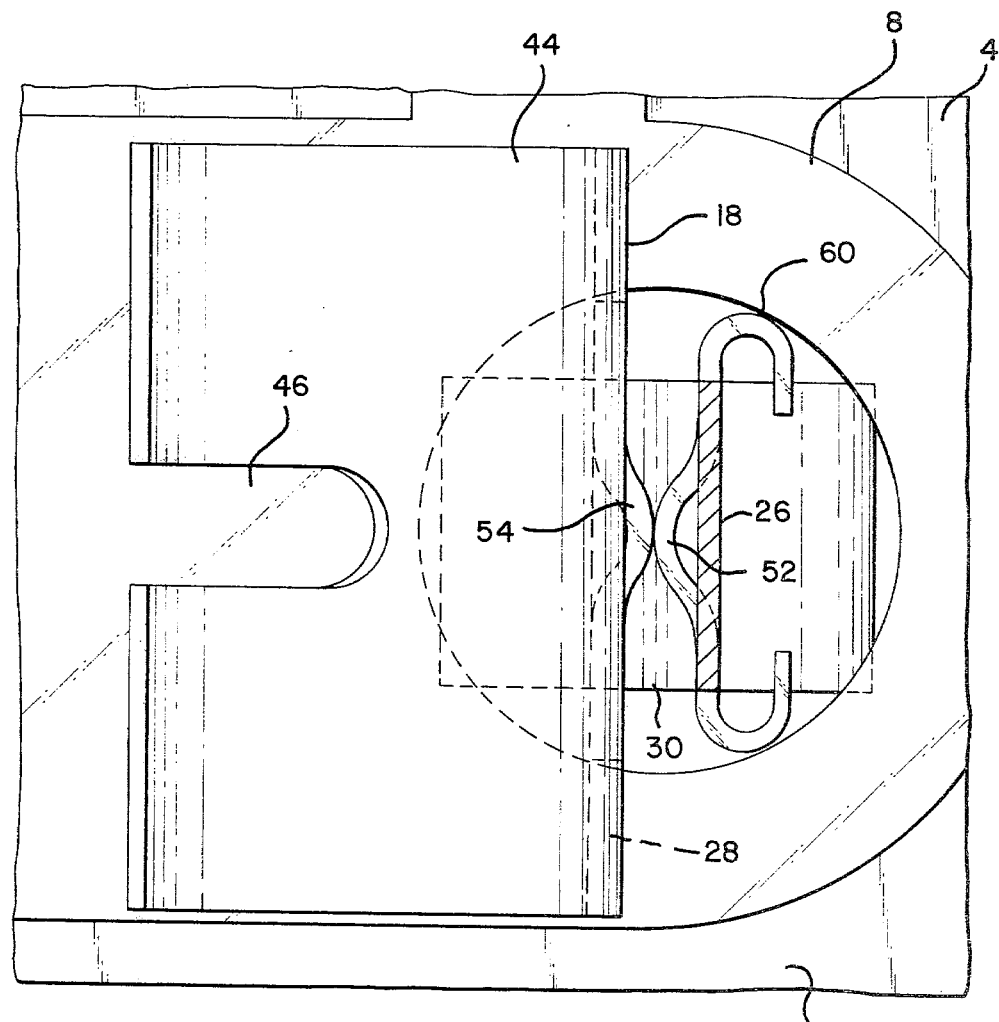
FIG. 4 is a view taken along the lines 4—4 of FIG. 3.

A spring contact device 2, FIGS. 1 and 2, in accordance with the invention is intended to be mounted in the upper surface 10 of a circuit board 4 in covering relationship to a first conductor 6 on the surface 10 and in electrical contact with at least one second conductor 8 on the circuit board. The contact device has a resilient platelike portion described below which can be flexed towards and into engagement with the first conductor 6 so that while the resilient plate portion is held against this conductor 6, a circuit path will be established between the conductors 6 and 8. The circuit board 4 may have all of its conductors on its upper surface 10, as viewed in the drawing, and need not have any conductors on its lower downwardly facing surface 12.

Spring contact device 2 is a stamped and formed resilient sheet metal and has a rectangular platelike section 14 having parallel side edges 16 and ends 18. The rectangular platelike portion may have an upwardly formed crown 22 which can be flexed downwardly from its normal position and into engagement with a circuit conductor 6 and which will, upon removal of force therefrom, return to its normal position. The device can be produced by stamping and forming any suitable material having the desired spring properties, a stainless steel having a thickness of about 0.075 mm having been found to be quite suitable.

The device is mounted on the circuit board by means of mounting legs 24 which extend from the ends 18 and which are substantial mirror images of each other. Each leg has a first straight portion 26, a second straight portion 28, beside the first straight portion, a connecting reversely formed bight 30, which joins the two straight portions, and a free end spring arm portion 32 which extends from the second straight portion 28. Each leg is provided with several notable structural features which contribute to its effectiveness and which permit it to be mounted in a circuit board without soldering, as will be described below. The details of these features can best be understood from an inspection of the flat blanks, FIG. 8, which shows the elongated metal strips 24' from which the legs are formed. The parts of these elongated strips at each end of the rectangular portion of the blank are identified by the same reference numerals, differentiated by prime marks, as are used to identify the structural features of the formed legs, as shown in FIGS. 1-7.

Each leg is connected to the adjacent end of the rectangular section by a connecting neck 27' and has a relatively wide section 34' immediately adjacent to this connecting neck. The side edges of the legs taper inwardly, as shown at 36', to a section of uniform and relatively narrow width 38'. Upon forming, the elongated strips are reversely bent in approximately the centers of these uniform width sections 38' so that each of the straight portions 26, 28 is relatively narrow at its lower end and the bight portion 30 is also relatively narrow.

The side edges taper outwardly, as shown at 40', to a short section 42' of increased width, although the width of this section is less than that of the section 34'. These intermediate width sections 42' then merge a relatively wide end portion 44', reentrant notches being provided between the sections 44' and 42' so that ears are formed, as shown at 48', which in the finished device function as stop members. The outer edge of the relatively wide section 44' is centrally notched, as shown at 46'. This relatively wide portion 44' becomes the contact portion 32 in the formed device and the central notch 46' divides the contact area which engages one of the conductors 8 into two sections.

Figure 5:
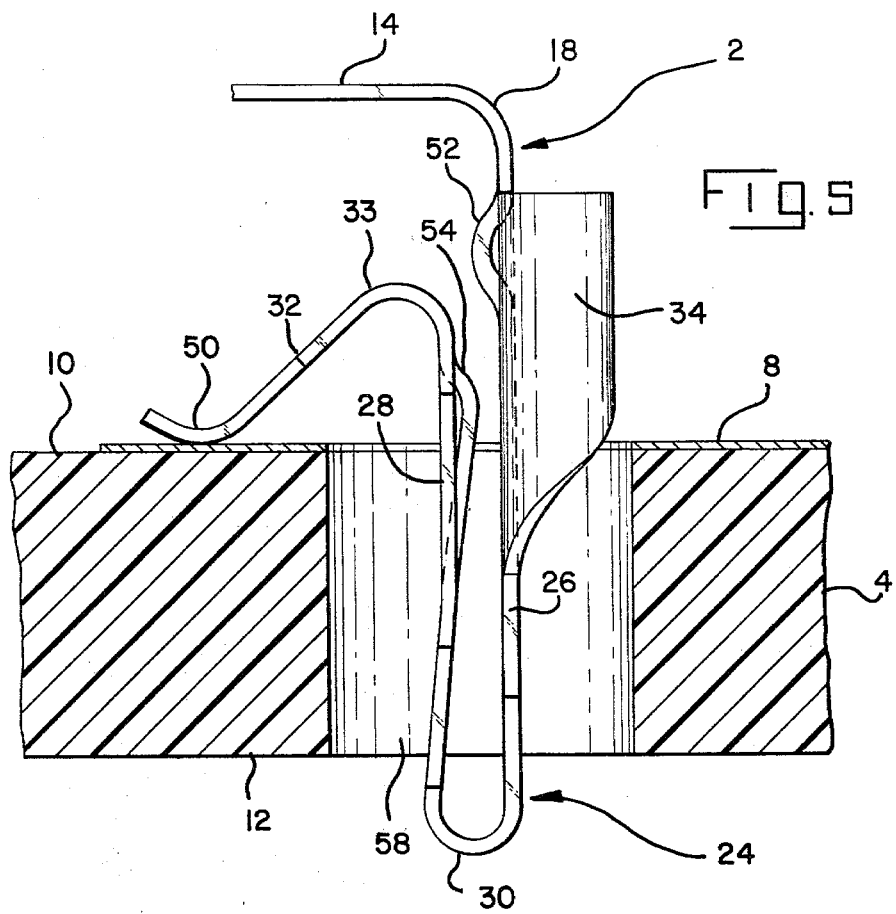
FIG. 5 is a sectional view on an enlarged scale showing one of the mounting legs of the contact device in a circuit board hole immediately prior to deformation of the lower portion of the leg.

During the forming operations in which the flat blank of FIG. 8 is formed into the finished contact device of FIGS. 1-8, the relatively wide sections 34' of the blank are reversely formed outwardly, as shown at 34 in FIG. 1, so that they extend away from the center of the device. These ears 34 have upwardly facing edges 60 which provide a bearing surface for an insertion punch or the like, which is used to drive the contact device into the circuit board holes 58. The end portions of the blank 42', 44' are reversely formed so that the spring arm portion 32 extends downwardly, as viewed in FIGS. 5 and 6, at an angle of about 45° relative to the second straight portion 28, see FIG. 5. The reverse bend 33, FIG. 5, is located such that the previously identified ears 48' of the blank now become downwardly facing stop surfaces 48 which bear against the surface of the circuit board on each side of the hole 58 during installation. As is apparent from FIG. 5, the end portion of the blank is bent inwardly so that the second straight portions 28 of the legs and the spring arm portions 32 are beneath the rectangular platelike section 14. The end of the spring arm portion is upwardly formed, as shown at 50, to provide an arcuate contact surface for engagement with the associated conductor 8.

Finally, dimples 52 and 54 are provided on the opposed surfaces of the straight portions of the legs 26, 28. The dimple 52 is located on the upper end of the leg and above the dimple 54 on the second straight portion 28. The dimple 52 is generally spherical, while the dimple 54 is generally conical and of reduced width along the length of the second straight portion of the leg.

Figure 6:
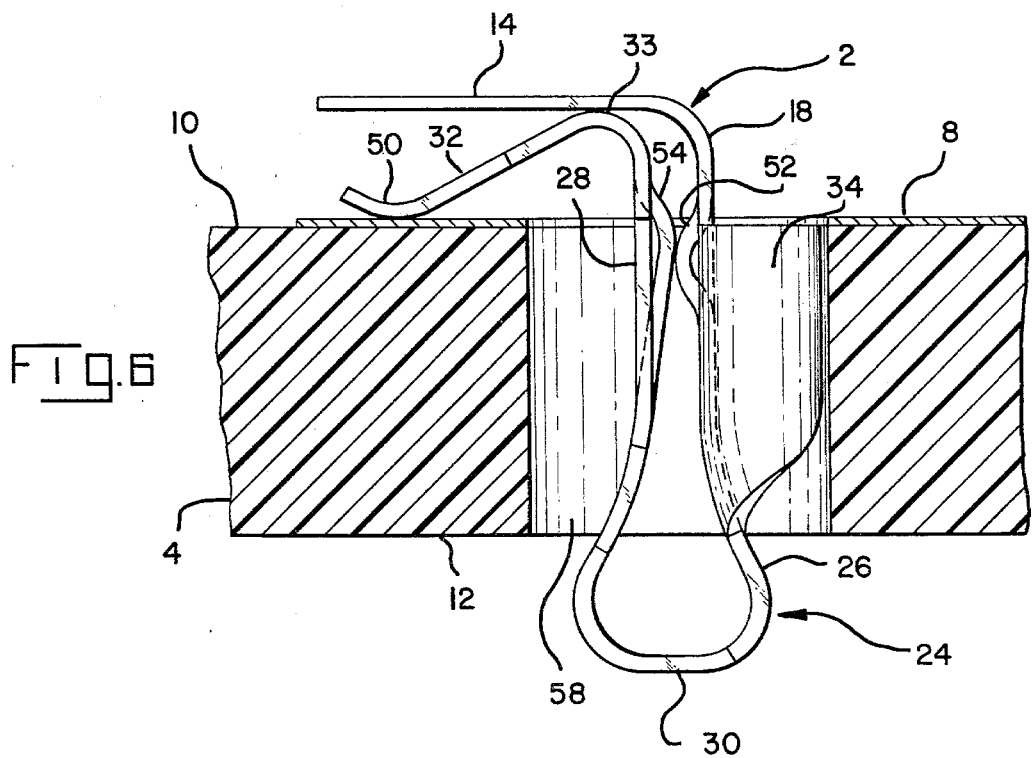
FIG. 6 is a view similar to FIG. 5 showing the position of the parts after the device has been installed on the circuit board and illustrating the deformation which is imparted to the mounting leg as the result of installation.

A contact device 2 is mounted on the circuit board by simply aligning the legs 24 with the holes 58 in the circuit board and moving the device downwardly until the stops 48 move against the upper surface of the circuit board or against those portions of the circuit board which are covered by one of the conductors 8. Since the width of this portion of the leg is greater than the diameter of the circuit board hole 58, the second straight portion 28 of the leg and the spring arm portion 32 cannot move further into the opening 58. Thereafter, a relatively high force is imposed on the edges 60 of the ears 34 of each leg so that the straight portion 26 of each leg is placed in compression and the second straight portion 28 of each leg is subjected to extremely high tensile forces. These stresses will be extremely high even though the insertion force is not extremely high, because of the fact that the bight portion of each leg 30 and the lower parts of the first and second straight portions are reduced width, as previously explained and as illustrated by FIG. 8. The imposition of these high stresses causes drastic deformation and plastic flow of the material in the lower reduced width portions of the legs with resulting buckling, so that the material of the legs in the vicinity of the bight portions 30 moves laterally, as shown by FIG. 6. The metallurgical cold working of these lower portions of the legs causes yielding of the metal as the result of the plastic deformation, so that the legs cannot return to their previous positions after this drastic cold-working. During insertion, the opposed bosses 52, 54 are moved against each other and the straight portions 26, 28 of the legs are also moved apart so that an interference fit of these straight portions in the circuit board holes is obtained. The edges of the straight portions of the legs move into the walls of the circuit board holes and the device cannot thereafter be removed from the circuit board.

After the device has been installed on the circuit board, as shown in FIG. 6, it is ready for service and a circuit path can then be established from the conductors 8 to the conductor 6 by simply pressing on the rectangular platelike member 14. The crown portion 22 will then be moved downwardly, as shown in FIG. 7, until it contacts the conductor 6 and the circuit path from the conductor 6 to the conductor 8 is established.

A significant feature of the invention is that when the crown portion 22 is moved downwardly, some of the force applied to the crown is transmitted at the reverse bends 33 of the legs to the spring arm portions 32 thereof, and the spring arm portions 32 are caused to move downwardly by a slight distance so that the contact portions of the spring arms rub over the surfaces of the conductors 8. As a result, a cleaning action of the contact surfaces is achieved every time the switch device is closed by application of finger pressure to the crown 22 and a reliable contact is thereby assured.

It will be apparent from the foregoing description that assembly of a contact device, in accordance with the invention, to a circuit board merely requires alignment of the legs of a circuit device with the circuit board holes and downward movement of the device in a manner such that the legs will enter the circuit board holes and the required deforming force will be applied to the edges 60 of the legs. An insertion operation of this type can readily be carried out with known types of insertion equipment and it is desirable to produce contacts in continuous strip form, FIG. 9, so that the strip can be fed to the insertion apparatus and the entire insertion operation carried out in an automatic mode.

The principles of the invention are usable under many circumstances other than those shown and illustrated by the specific example presented above. For example, the platelike member can be round, rather than rectangular, and a contact device might be provided with only a single leg, or more than two legs, rather than a pair of legs as shown. In the event that it becomes necessary to use a contact device on a circuit board having conductors on the underside 12, the legs can be soldered to the conductor 8 on the underside 12 of the circuit board in the usual manner.

Figure 10:
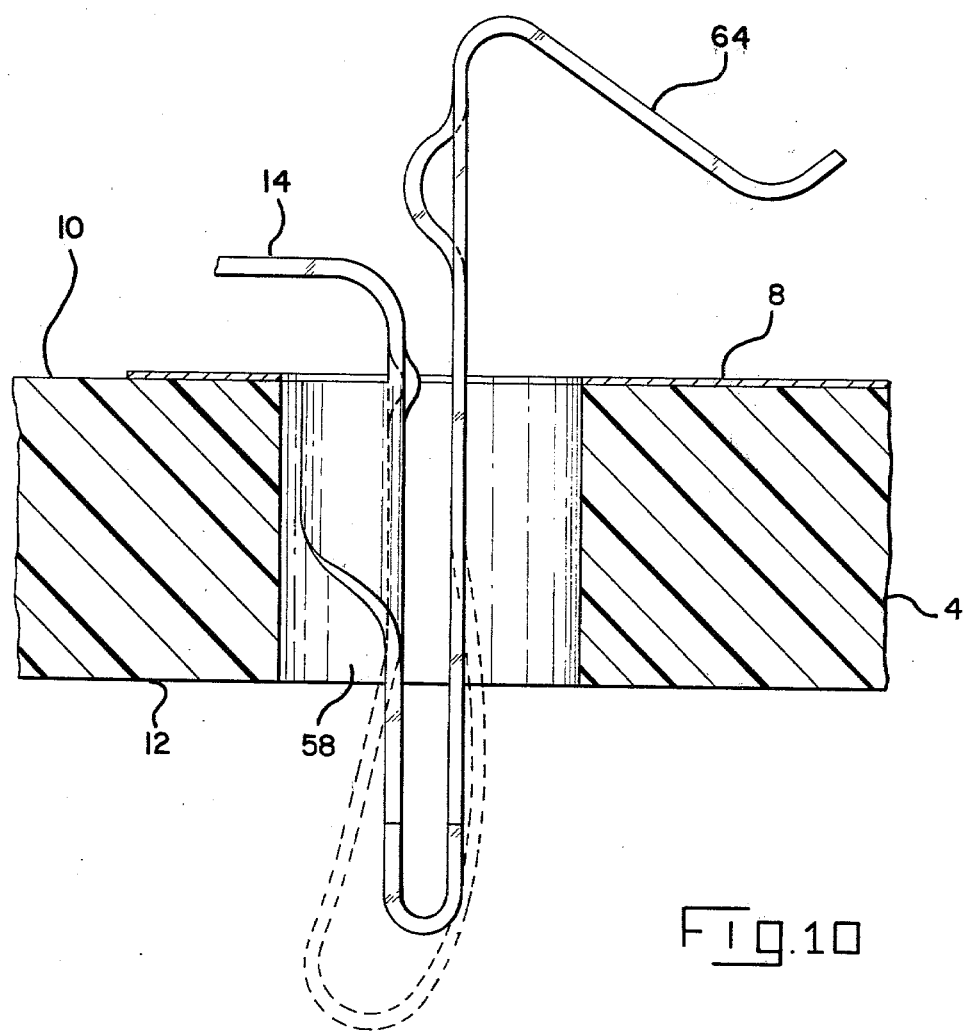
FIG. 10 is a view similar to FIG. 7 of an alternative embodiment.

Under some circumstances, it may be preferable to form the elongated strips which extend from the ends of the blank of FIG. 8 in a manner such that the spring arm portion of each leg stands laterally away from the platelike section 14 as shown in FIG. 10. This alternative may be required, for example, where the locations of the second conductors 8 on the circuit board dictate an outwardly extending spring arm.

I claim:

1. A platelike spring metal contact spring mounted on one surface of a circuit board and normally spaced from a first conductor on said one surface of said circuit board, said contact member having a pair of mounting legs extending into openings in said circuit board, at least one of said mounting legs being electrically connected to a second conductor in said circuit board whereby upon resilient movement of portions of said platelike member towards said circuit board, said platelike member contacts said first conductor, and a circuit path is established from said first conductor to said second conductor, said contact member being characterized in that:

each of said mounting legs comprises an elongated strip, said strip having a first straight portion which is integral at one end with, and which extends from, said platelike member, an intermediate bight portion, a second straight portion, and a free end spring portion, said first and second straight portions being in the associated opening in said circuit board, said first and second straight portions of each of said legs having opposed bosses thereon, said bosses being against each other and urging said first and second straight portions of said legs against the walls of said openings, said intermediate bight portion being located proximate to the other surface of said circuit board, said intermediate bight portion having deformed portions which extend laterally of said first and second straight portions, said free end spring portion extending from said second straight portion laterally across said one surface of said circuit board and inwardly with respect to said platelike metal contact member, said free end spring portion being beneath said platelike metal contact member and having a contact portion which is against said second conductor.

2. A spring metal contact member as set forth in claim 1, said first and second straight portions having an interference fit in said openings.

3. A spring metal contact member as set forth in claim 2, said free end spring portion of each of said legs having a bearing portion which bears against said platelike metal contact member whereby upon application of a force against said contact member to flex said contact member towards said first conductor, said force is partially transmitted through said bearing portions to said free end spring portions.

4. A spring metal contact member as set forth in either of claims 1 or 3, said platelike member being substantially rectangular.

5. A spring metal contact member as set forth in claim 4, each of said legs having laterally extending stop means extending from said second straight portion, said stop means being proximate to said one surface of said circuit board and preventing movement of said second leg portions into said openings beyond said stop means.

6. A platelike spring metal contact member having a pair of mounting legs extending therefrom, said mounting legs being intended for insertion into circuit board holes for mounting said contact member on said circuit board in covering relationship to a first conductor and in electrical contact with a second conductor so that upon application of a force to said platelike contact member with resulting resilient movement of said contact member towards, and against, said first conductor, a circuit path is established from said first conductor to said second conductor, said spring metal contact member being characterized in that:

each of said mounting legs comprises an elongated strip of sheet metal extending from said contact member, said strip being bent transversely of its length to form said legs, each of said legs comprising a first straight portion which is integral at one end thereof with said contact member, an intermediate bight portion, a second straight portion, and a free end spring arm portion, said first and second straight portions being side-by-side and having distal ends which are remote from said contact member, said distal ends being connected to each other by said bight portions, said first and second straight portions of each of said legs having opposed bosses thereon, said bosses being adjacent to each other and offset along the lengths of said straight portions, said free end spring arm portion extending laterally from the end of said second straight portion which is proximate to said platelike contact member, stop means on said second straight portion proximate to said spring arm portion for preventing movement of said leg through said circuit board hole beyond said stop means, and shoulder means on said first straight portion for a pushing member tending to push said leg into said circuit board hole whereby, upon insertion of said legs into said circuit board holes until said stop means are against said circuit board, and upon application of pushing forces against said shoulder means, said first and second straight portions are deformed laterally in the vicinity of said bight portions, and said straight portions are displaced axially with respect to each other and said bosses are brought into opposed aligned relationship whereby said straight portions are cammed apart and moved against the walls of said holes and said legs retained in said holes.

7. A spring metal contact member as set forth in claim 6, said platelike member being substantially rectangular.

8. A spring metal contact member as set forth in claim 6, said spring arm portions of said legs extending inwardly of said platelike member and towards each other.

9. A spring metal contact member as set forth in claim 6, said first and second leg portions and said bight portion being weakened to encourage deformation when said pushing forces are applied against said shoulders.

* * * * *